US010950790B1

United States Patent
Marinella et al.

(10) Patent No.: US 10,950,790 B1
(45) Date of Patent: Mar. 16, 2021

(54) TWO-TERMINAL ELECTRONIC CHARGE RESISTANCE SWITCHING DEVICE

(71) Applicant: National Technology & Engineering Solutions of Sandia, LLC, Albuquerque, NM (US)

(72) Inventors: Matthew Marinella, Gilbert, AZ (US); Sapan Agarwal, Cambridge, MA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 16/798,723

(22) Filed: Feb. 24, 2020

Related U.S. Application Data

(60) Provisional application No. 62/809,882, filed on Feb. 25, 2019.

(51) Int. Cl.
H01L 45/00 (2006.01)
G11C 13/00 (2006.01)

(52) U.S. Cl.
CPC ......... H01L 45/145 (2013.01); G11C 13/004 (2013.01); G11C 13/0069 (2013.01); G11C 13/0097 (2013.01); H01L 45/1233 (2013.01); H01L 45/1253 (2013.01); G11C 2013/005 (2013.01); G11C 2013/009 (2013.01); G11C 2213/34 (2013.01)

(58) Field of Classification Search
CPC .............. H01L 45/145; H01L 45/1233; H01L 45/1253; G11C 13/0069; G11C 13/004; G11C 13/0097; G11C 2013/009; G11C 2013/005; G11C 2213/34

USPC ......................................................... 365/148
See application file for complete search history.

(56) References Cited

U.S. PATENT DOCUMENTS

| 10,896,973 | B2 * | 1/2021 | Levy ..................... G11C 16/10 |
| 2008/0283901 | A1 * | 11/2008 | Walker ............... H01L 29/7887 257/324 |
| 2009/0290407 | A1 * | 11/2009 | Mouli ................... H01L 27/101 365/158 |
| 2010/0048020 | A1 * | 2/2010 | Schrott ............... H01L 45/1273 438/692 |
| 2015/0200013 | A1 * | 7/2015 | Lin ....................... G11C 11/005 365/185.18 |

(Continued)

OTHER PUBLICATIONS

Agarwal, S. et al., "Using Floating Gate Memory to Train ideal Accuracy Neural Networks," arXiv:1901.10570 [cs.ET] (v.1 submitted Jan. 29, 2019, v.2 submitted Feb. 27, 2019), 6 pages.

(Continued)

*Primary Examiner* — Fernando Hidalgo
(74) *Attorney, Agent, or Firm* — Martin I. Finston

(57) ABSTRACT

A two-terminal memory device and methods for its use are provided. In the device, a bottom electrode is electrically continuous with a first operating terminal, and a control gate electrode is electrically continuous with a second operating terminal. A stack of insulator layers comprising a hopping conduction layer and a tunnel layer is contactingly interposed between the bottom electrode and the control gate electrode. The tunnel layer is thinner than the hopping conduction layer, and it has a wider bandgap than the hopping conduction layer. The hopping conduction layer consists of a material that supports electron hopping transport.

8 Claims, 3 Drawing Sheets

(56) References Cited

U.S. PATENT DOCUMENTS

| | | | | |
|---|---|---|---|---|
| 2016/0254058 A1* | 9/2016 | Cronin | ............... | G11C 16/0466 |
| | | | | 365/185.18 |
| 2018/0351003 A1* | 12/2018 | Jenne | ................ | H01L 21/02332 |
| 2019/0180820 A1* | 6/2019 | Widjaja | ............ | H01L 27/10802 |
| 2019/0198109 A1* | 6/2019 | Li | ......................... | H01L 45/145 |
| 2019/0279729 A1* | 9/2019 | Chen | ................. | G11C 16/0466 |
| 2020/0098434 A1* | 3/2020 | Lang | ................. | H01L 27/11582 |
| 2020/0303023 A1* | 9/2020 | Chen | ...................... | G11C 16/30 |

OTHER PUBLICATIONS

Jacobs-Gedrim, R. B. et al., "Analog high resistance bilayer RRAM device for hardware acceleration of neuromorphic computation," Journal of Applied Physics (2018) 124:202101, 11 pages.

Jacobs-Gedrim, R. B. et al., "Analog Conductance Response in High Resistance Bilayer RRAM Device for Hardware Acceleration of Neuromorphic Computation," SAND2018-5869J, Sandia National Laboratories (2018), 17 pages.

White, M. H. et al., "On the Go with Sonos," IEEE Circuits and Devices Magazine (2000) pp. 22-31.

* cited by examiner

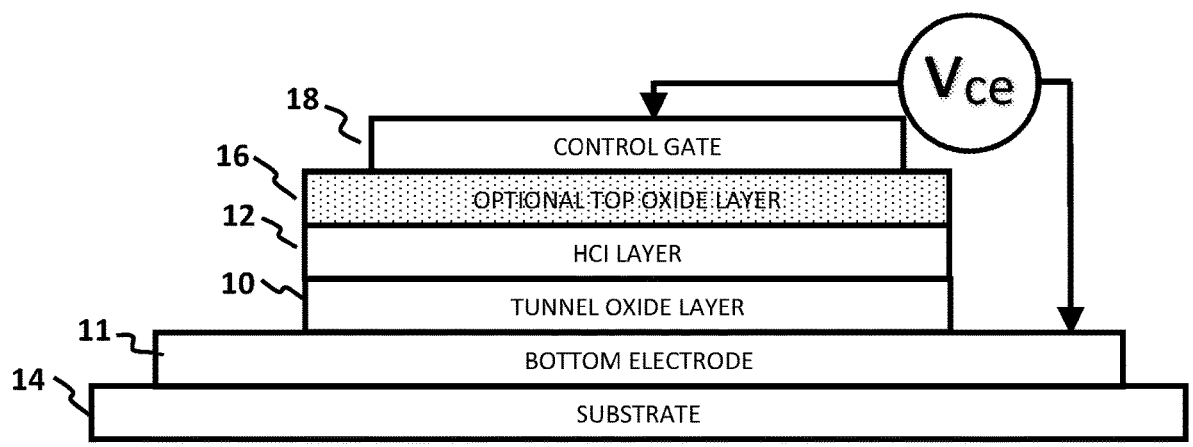
FIG. 1
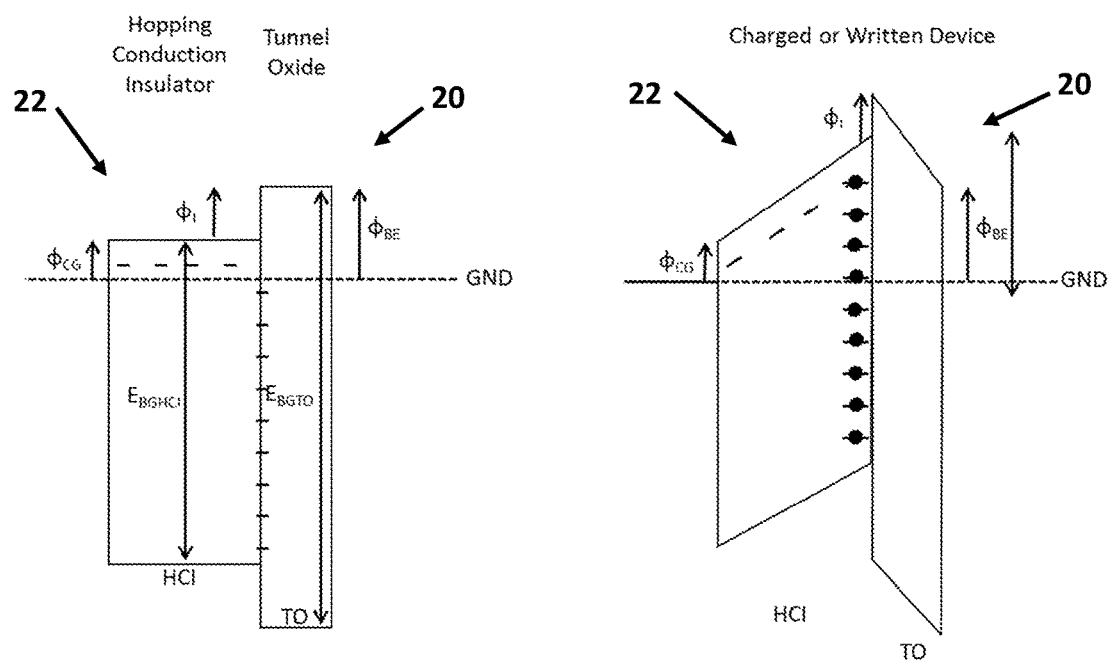
FIG. 2 FIG. 3

TWO-TERMINAL ELECTRONIC CHARGE RESISTANCE SWITCHING DEVICE

CROSS-REFERENCE TO RELATED APPLICATION

This application claims the benefit of U.S. Provisional Application No. 62/809,882, filed on Feb. 25, 2019, the entirety of which is hereby incorporated herein by reference.

ACKNOWLEDGEMENT OF GOVERNMENT SUPPORT

This invention was made with Government support under Contract No. DE-NA0003525 awarded by the United States Department of Energy/National Nuclear Security Administration. The Government has certain rights in the invention.

FIELD OF THE INVENTION

The invention relates to semiconductor memory devices, and more particularly to two-terminal devices for information storage.

Art Background

A two-terminal resistance switching device can store information in the form of a resistance state that can be modified by a programming current that is applied without the use of a third, "gate" terminal. Such devices constitute a recognized class of nonvolatile memory. They have also found use in applications such as analog computing, and they have been proposed for use as synapses in artificial neural networks.

Examples of resistance switching devices include the resistive random-access memory (ReRAM) and the conductive bridging random access memory (CBRAM). These are examples of devices that modulate resistance with the transport of charged anions and cations.

A recently developed ReRAM is described, for example, in R. B. Jacobs-Gedrim et al., "Analog high-resistance bilayer RRAM device for hardware acceleration of neuromorphic computation," *J. Appl. Phys.* 124 (2018) 202101 (11 pages). The device described there is believed to modulate resistance using the transport of oxygen vacancies.

There is ongoing interest in other possible mechanisms for resistance switching. The discovery of new mechanisms may lead to improvements in performance parameters such as switching speed, endurance, retention time, and switching voltages and currents.

BRIEF DESCRIPTION OF THE DRAWINGS

FIG. 1 is a notional cross-sectional view of an example MNOM device.

FIG. 2 is a simplified band diagram of an example MNOM device in flatband condition.

FIG. 3 is a simplified band diagram of the example MNOM device in a charged state.

DETAILED DESCRIPTION

Figure 4:
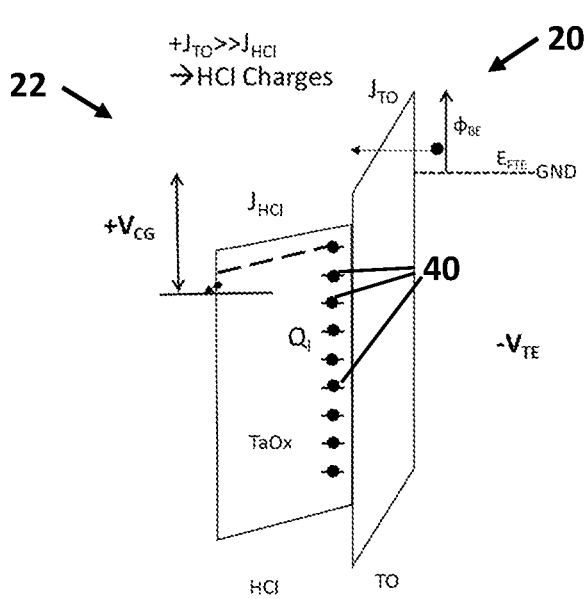
FIG. 4 is a simplified band diagram of the example MNOM device with a positive write voltage applied to its control gate.

We have developed a new resistance switching device. In terms of the underlying mechanism, our device may be viewed as a type of charge tunnel junction device. That is, the conduction is modulated by the variable height of a tunnel barrier. The barrier height is controlled by alternately charging and discharging the device.

We describe our device as a metal-nitride-oxide-metal (MNOM) device, in reference to its layer structure. An example MNOM device is shown notionally in FIG. 1.

The MNOM device is structurally similar to the gate stacks of two well-known three-terminal semiconductor memories, namely, the semiconductor-oxide-nitride-oxide-semiconductor (SONOS) memory and the metal-nitride-oxide-semiconductor (MNOS) memory.

The SONOS and MNOS devices require a semiconductor layer, because they operate by modulating the charge in, e.g., the channel of a semiconductor field effect transistor.

The MNOM device, by contrast, does not require a semiconductor layer. As noted above, it operates, instead, by charge transport through insulating layers that is modulated by the variable height of a tunnel barrier. This is discussed further below.

A brief introduction to SONOS technology may be found, for example, in Marvin White et al., "On the go with SONOS," IEEE Circuits and Devices Magazine, July 2000, pp. 22-31. A description of a SONOS device with applications to neural networks may be found, for example, in Sapan Agarwal et al., "Using Floating Gate Memory to Train Ideal Accuracy Neural Networks," arXiv:1901.10570 [cs.ET], submitted Jan. 29, 2019, hereinafter cited as "Agarwal 2019".

In illustrative embodiments, discussed here with reference to FIG. 1, the tunnel oxide (TO) layer 10 is a layer of silicon dioxide overlying a bottom electrode 11, and the hopping conduction insulator (HCI) layer 12 is a layer of silicon nitride. The various layers may be deposited on a silicon substrate 14, although other substrate materials may be used instead. Conventional fabrication processes may be used, such as those used to make SONOS devices.

For example, the SONOS device of Agarwal 2019, cited above, included a three-layer stack of oxide, nitride, and oxide, respectively, grown on a silicon substrate in a tunnel oxidation furnace in a dilute nitrous oxide atmosphere at 750° C. The respective layer thicknesses were approximately 2 nm for the bottom tunnel oxide layer, 9 nm for the intermediate nitride trapping layer, and 4 nm for the top oxide layer.

As indicated in the figure, an additional oxide layer 16 (labeled the "top oxide layer" in the figure) may be included between the control gate 18 and the HCI layer 12.

More generally, the tunnel oxide (TO) layer in our MNOM device should be thinner than the hopping conduction nitride (HCI) layer, and it should have a wider bandgap than the HCI layer. The TO layer should be thin enough to support appreciable tunnel current, but the HCI layer should be thick enough to preclude a significant amount of electron tunneling. However, the HCI layer must still support electron hopping transport. By way of example, a silicon dioxide tunnel layer would typically be less than 10 nm thick, and preferably less than about 5 nm thick.

The material compositions of the TO and HCI layers must be selected to assure that there is a voltage threshold above which the tunneling current is greater than the hopping current, and below which the hopping current is greater than the tunneling current. Conventional MNOS and SONOS devices have a similar requirement. Silicon dioxide and silicon nitride, respectively, are offered here as example compositions. However, these examples should be understood as nonlimiting, because other compositions (such as oxynitride compositions, among others) may also be useful in this regard and are not excluded from consideration.

Although we refer generally to our new device as an "MNOM" device, we do not mean to exclude implementations in which the nitride layer is replaced with a second oxide layer to form an $MO_1O_2M$ device. This is also feasible, provided that the first oxide will support a trap-assisted-tunneling current with the requisite characteristics. As explained above in regard to the optional oxide layer shown in FIG. 1, we also mean to include devices with a metal-oxide-nitride-oxide-metal (MONOM) structure that operate by the same underlying mechanism.

FIG. 2 is a simplified band diagram of the device in flatband condition (i.e., with no excess charge, and no electric fields, within the materials). The tunnel oxide 20 is on the right, and the nitride or other hopping conduction insulator 22 is on the left. As noted above, the TO layer will generally be thinner than the hopping conduction insulator (HCI), and it will have a wider band gap. The TO layer must be thin enough so that in operation, it can support appreciable tunnel current. However, the HCI layer is intentionally made too thick for electron tunneling. Instead, it must support electron hopping transport. Silicon nitride (SiN) is one example material that is useful in this regard.

In the example configuration of FIG. 2, which should be understood as non-limiting, the HCI layer is deposited on top of the TO layer, and the electrode that contacts the HCI layer is the control gate. We accordingly refer to the voltage applied to the control gate as the "control gate voltage $V_{CG}$", or equivalently as the "top electrode voltage $V_{TE}$". The electrode on the TO layer is the "back electrode".

As noted above, there must be a threshold voltage $V_{TH}$ with the property that when $V_{CG}$ is greater than $V_{TH}$, the tunneling current $J_{TO}$ is greater than the hopping current $J_{HCI}$, but when $V_{CG}$ is less than $V_{TH}$, $J_{HCI}$ is greater than $J_{TO}$. What is meant by $J_{TO}$, here, is the positive tunneling current. Its direction in the figure is from left to right. (We follow the usual convention that the direction of current flow is opposite to the direction of electron flow.)

In a non-limiting example, a suitable material combination is silicon dioxide ($SiO_2$) for the TO layer and silicon nitride (SiN) for the HCI layer.

Turning again to FIG. 2, it will be seen that the respective bandgap energies $E_{BGTO}$ and $E_{BGHCI}$ of the tunnel oxide and hopping conduction layers are indicated. In the configuration of FIG. 2, both the back electrode and the control gate electrode are at ground potential. The ground level is indicated in the figure by a broken horizontal line, labeled "GND".

Potentials $\Phi_{CG}$ and $\Phi_{BE}$ are indicated in the figure. Potential $\Phi_{CG}$ is the energy per unit charge to remove an electron from the Fermi level to the bottom of the conduction band in the nitride (i.e., in the hopping conduction layer) at the control gate. Potential $\Phi_{BE}$ is the energy per unit charge to remove an electron from the Fermi level to the bottom of the conduction band in the oxide (i.e., in the tunnel layer) at the back electrode. Each of these potentials is the difference between the pertinent work function (which is measured from the Fermi level to the vacuum level) and the pertinent electron affinity (which is measured from the bottom of the conduction band to the vacuum level).

The conduction band offset $\Phi_I$ between the hopping conduction layer and the tunnel layer is also indicated in the figure.

FIG. 3 is a simplified band diagram similar to FIG. 2, but in FIG. 3 the device is depicted in its charged state, after having been programmed (or equivalently, after having been "written"). As shown in the figure, there are now electric fields within the two layers 20, 22, due to trapped space charge at the interface.

The writing process will now be described with reference to FIGS. 4-6. As shown in FIG. 4, the device is "written" with a positive voltage $V_{CG}$ placed on the control gate. $V_{CG}$ is sufficient to drive a positive tunneling current that exceeds the hopping current. (That is, we require that $+J_{TO} \gg J_{HCI}$). In this case, electrons tunnel through the TO layer 20 and across the interface into the HCI layer 22 faster than they are expelled by hopping conduction through and out of the HCI layer. As a result, the HCI layer gains a net negative electron charge, which is indicated notionally in the figure by the occupied intra-gap states 40 near the interface.

When the bias is removed, the charge 40 in the HCI layer remains near the interface. The resulting band configuration is represented notionally in the simplified band diagram of FIG. 6. (For simplicity of presentation, band bending has been omitted.) As indicated in the figure, the charged device will slowly lose charge from the HCI layer 22 due to hopping conduction in the electric field across that layer. However, the leakage in a properly designed device will be low enough for the charged state to be retained for years. (We expect the charged state to endure, typically, for up to ten years at a temperature of 85° C.)

Figure 5:
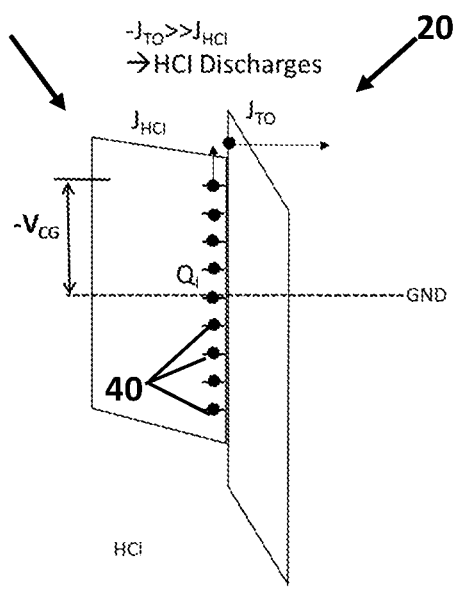
FIG. 5 is a simplified band diagram of the example MNOM device when it is being discharged.
Figure 6:
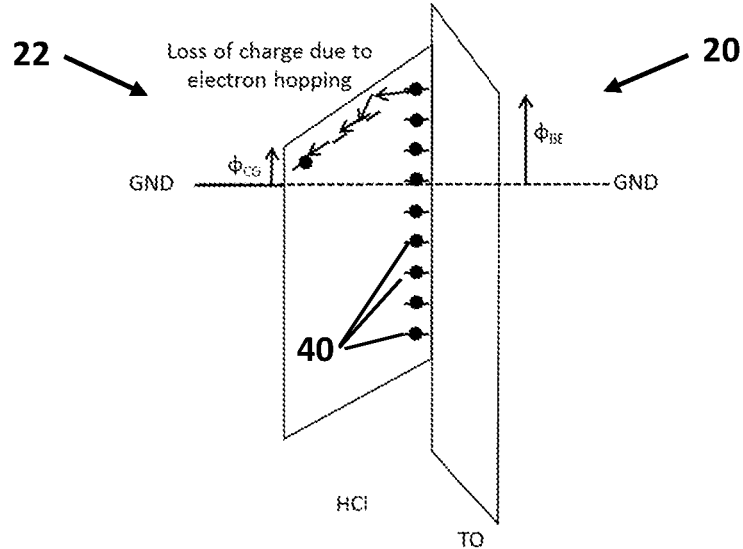
FIG. 6 is a simplified band diagram of the example MNOM device when it is under zero bias subsequent to a write operation.

Erasure, which is the discharging operation, is illustrated in FIG. 5. The device is erased by placing a negative voltage $V_{CG}$ on the control gate, set to a value such that the trapped charge 40 can tunnel out of the HCI layer 22 through the tunnel oxide 20. The tunneling current to the back electrode exhausts charge from the device faster than it can be resupplied by the hopping process. (That is, we require $-J_{TO} \gg J_{HCI}$).

There is also a read process that can distinguish between the charged state and the discharged state of the device. The read process is illustrated in FIGS. 7 and 8.

We read the two-terminal device state by applying a positive voltage pulse to the control gate. The voltage pulse is tailored to be of shorter duration or of lower voltage than the programming pulse, so that it will cause less charge transfer than the programming pulse by a factor of ten or more. (That is, we desire to have $Q_{program} \gg Q_{read}$.)

Figures 7, 8:
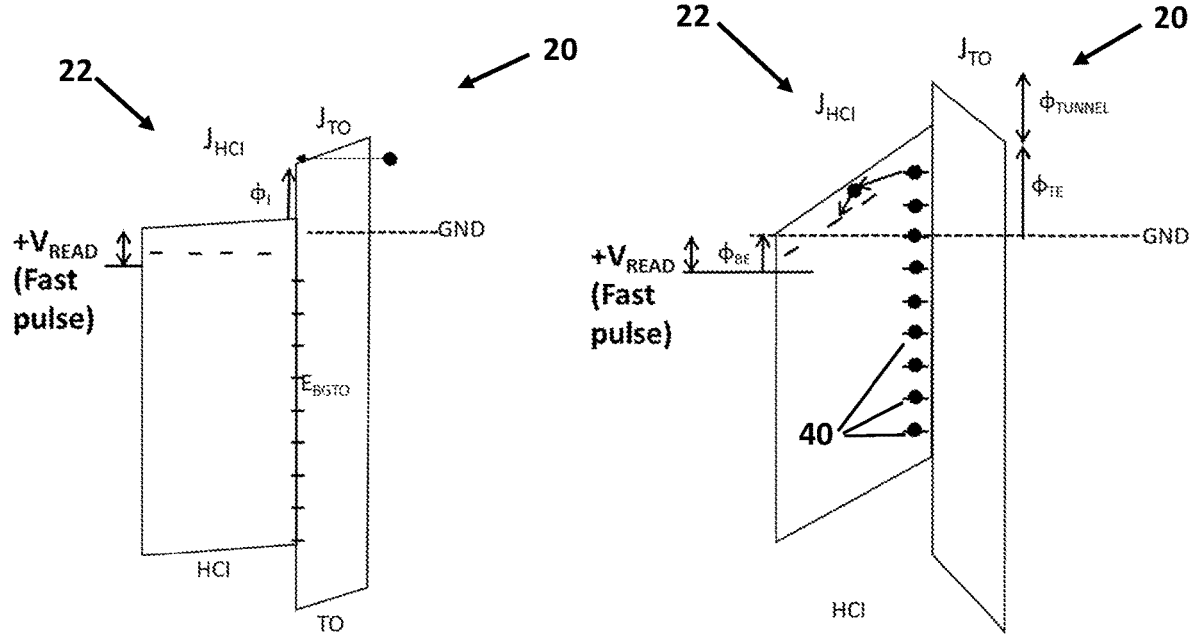
FIG. 7 is a simplified band diagram of the example MNOM device when it is in its discharged state during a read operation.
FIG. 8 is a simplified band diagram of the example MNOM device when it is in its charged state during a read operation.

The band diagram of FIG. 7 illustrates the read operation when the device is in its discharged state, and the band diagram of FIG. 8 illustrates the read operation when the device is in the charged state.

In either case, the amount of current that is delivered during the short positive read pulse will be dependent on the charge stored in the device. In the case of the discharged device (FIG. 7), the current through the device will be low because little charge is stored in the HCI layer 22 (e.g., the nitride layer), and the field across the HCI nitride is too weak to drive a significant amount of hopping current. But in the case of the charged device (FIG. 8), enough charge 40 is expected to escape from the HCI layer to produce a relatively high read current $J_{PGM}$ during the read pulse.

It is noteworthy in this regard that the read operation is partially destructive. That is, each read pulse will cause some loss of stored charge. However, many sequential read operations will be possible, provided that the read current is small enough in amplitude and short enough in duration.

It should also be noted that in principle, the read operation can occur even without an applied voltage bias. That is, the MNOM device when in its charged state will be continuously leaking current. However, the device can be designed to assure that this current will be extremely low; so low, in fact, as to maintain charge over periods of years. Leakage currents of 10 attoamperes or less are expected to be typical. Hence, the leakage current in properly designed devices is expected to lie below the detection limits of typical electronic read circuitry.

It will be understood from the above discussion that the read, write, and erase operations are performed by applying bias voltages between two operating terminals, one electrically continuous with the control gate electrode 18, and the other electrically continuous with the bottom electrode 11. It will also be understood that as a "two-terminal device", the MNOM device has only these two terminals as operating terminals. In other words, it has only a first operating terminal and a second operating terminal. By "operating terminal" is meant one of the two terminals across which the bias voltage is applied to effectuate the read, write, or erase operation. The presence of terminals of other kinds not directly involved in these operations is not excluded. Thus, for example, there may additionally be terminals for diagnostic purposes, for fixing a body potential, and the like.

There is a continuum of states between the fully charged condition and the fully discharged condition. Hence, the programmable resistance can serve as the basis for an analog tunable memory as well as a digital memory. In principle, a suitably designed device would be able to store thousands of distinguishable states. However, our current findings indicate that the write operation requires the application of at least a threshold voltage in order for tunneling to occur. A typical threshold value is expected to be about 5V. The write pulse for analog storage would generally be shorter in duration than the write pulse for digital storage. A pulse duration of about 10 μs is expected to be typical for analog storage.

As we noted above, a device with metal-oxide-nitride-oxide-metal (MONOM) layer structure could operate with the same underlying physical mechanism. Such a device is considered to fall within the scope of the present invention. The primary distinction offered by such a device is simply that the top oxide will reduce the hopping current that escapes during the read operation, and it will reduce the leakage current during unbiased state retention.

The invention claimed is:

1. A two-terminal memory device comprising a bottom electrode electrically continuous with a first operating terminal of the device and a control gate electrode electrically continuous with a second operating terminal of the device, and further comprising a stack of insulator layers contactingly interposed between the bottom electrode and the control gate electrode, wherein:
   the stack of insulator layers comprises a hopping conduction layer and a tunnel layer;
   the tunnel layer is thinner than the hopping conduction layer and has a wider bandgap than the hopping conduction layer; and
   the hopping conduction layer consists of a material that supports electron hopping transport.

2. The two-terminal memory device of claim 1, wherein:
   the bottom electrode is a metal layer disposed on a substrate;
   the tunnel layer is an insulative layer that contacts and overlies the bottom electrode;
   the hopping conduction layer is an insulative layer that contacts and overlies the tunnel layer; and
   the control gate electrode is a metal layer disposed over the hopping conduction layer.

3. The two-terminal memory device of claim 2, wherein the control gate electrode is disposed directly on the hopping conduction layer.

4. The two-terminal memory device of claim 2, wherein the control gate electrode is disposed directly on a further insulator layer disposed on the hopping conduction layer.

5. The resistive memory device of claim 1, wherein the tunnel layer comprises silicon dioxide and the hopping conduction layer comprises silicon nitride.

6. A method of information storage, comprising applying a charging bias voltage across a bilayer of different insulating material layers having an interface between them, wherein:
   the bilayer consists of a tunnel layer and a hopping conduction layer;
   the charging bias voltage is effective to tunnel electrons across the tunnel layer and across the interface, but is not effective to drive the tunneled electrons across the hopping conduction layer;
   the method further comprises removing the charging bias voltage while the tunneled electrons are trapped at the interface;
   the bilayer is included in a two-terminal memory device having only a first operating terminal and a second operating terminal;
   the first operating terminal is electrically continuous with a bottom electrode, and the second operating terminal is electrically continuous with a control gate electrode;
   the bilayer is contactingly interposed between the bottom electrode and the control gate electrode; and
   the charging bias voltage is applied between the first operating terminal and the second operating terminal.

7. The method of claim 6, further comprising erasing the bilayer before applying the charging bias voltage, wherein:
   the erasing of the bilayer comprising applying a discharging bias voltage;
   the discharging bias voltage is opposite in sign to the charging bias voltage;
   the discharging bias voltage is effective to drive trapped electrons out of the hopping conduction layer, across the interface, and across the tunnel layer; and
   the discharging bias voltage is applied between the first operating terminal and the second operating terminal.

8. A method of information retrieval, comprising applying a reading bias voltage across a bilayer of different insulating material layers having an interface between them, wherein:
   the bilayer consists of a tunnel layer and a hopping conduction layer;
   the reading bias voltage is effective to drive trapped electrons away from the interface and across the hopping conduction layer by electron hopping transport, but is ineffective to drive electrons across the tunnel layer;
   the reading bias voltage is less than a threshold voltage for electron tunneling in the tunnel layer;
   the bilayer is included in a two-terminal memory device having only a first operating terminal and a second operating terminal;

the first operating terminal is electrically continuous with a bottom electrode, and the second operating terminal is electrically continuous with a control gate electrode;

the bilayer is contactingly interposed between the bottom electrode and the control gate electrode; and the reading bias voltage is applied between the first operating terminal and the second operating terminal.

\* \* \* \* \*